(12) United States Patent
Shui et al.

(10) Patent No.: US 11,257,402 B2
(45) Date of Patent: Feb. 22, 2022

(54) FOLDABLE DISPLAY MODULE, METHOD OF MANUFACTURING FOLDABLE DISPLAY MODULE, DISPLAY APPARATUS AND HEAT DISSIPATION METHOD

(71) Applicants: Chengdu BOE Optoelectronics Technology Co., Ltd., Sichuan (CN); BOE Technology Group Co., Ltd., Beijing (CN)

(72) Inventors: Yudan Shui, Beijing (CN); Xuan Luo, Beijing (CN); Zhengmao Yu, Beijing (CN); Yanping Ren, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 53 days.

(21) Appl. No.: 16/914,719

(22) Filed: Jun. 29, 2020

(65) Prior Publication Data

US 2021/0192982 A1 Jun. 24, 2021

(30) Foreign Application Priority Data

Dec. 20, 2019 (CN) .......................... 201911323458.X

(51) Int. Cl.
*G09F 9/30* (2006.01)
*H01L 27/32* (2006.01)
(Continued)

(52) U.S. Cl.
CPC .......... *G09F 9/301* (2013.01); *H01L 27/3227* (2013.01); *H01L 51/529* (2013.01); *H01L 51/56* (2013.01); *H01L 2251/5338* (2013.01)

(58) Field of Classification Search
None
See application file for complete search history.

(56) References Cited

U.S. PATENT DOCUMENTS 5,724,818 A * 3/1998 Iwata ...................... H01L 23/38
257/E23.082
7,731,377 B2 * 6/2010 Moriya ............. G02F 1/133603
362/97.3
(Continued)

FOREIGN PATENT DOCUMENTS

CN 101532657 A 9/2009
CN 202546687 U 11/2012
(Continued)

OTHER PUBLICATIONS

Sekar, Krishna. "Power and Thermal Challenges in Mobile Devices." Proceedings of the 19th Annual International Conference on Mobile Computing Networking—MobiCom '13, 2013, https://doi.org/10.1145/2500423.2505320. (Year: 2013).*
(Continued)

*Primary Examiner* — J. E. Schoenholtz
(74) *Attorney, Agent, or Firm* — Westerman, Hattori, Daniels & Adrian, LLP

(57) ABSTRACT

In one embodiment, a foldable display module includes a foldable OLED display panel; a heat conduction unit and a heat dissipation unit sequentially disposed on the OLED display panel in a direction away from a light exit side of the OLED display panel; and a plurality of semiconductor sinks located between the heat conduction unit and the heat dissipation unit, wherein the heat conduction unit is adhered to a side of the OLED display panel away from the light exit side and is configured to conduct heat from the OLED display panel; the semiconductor sinks are disposed on the heat conduction unit; the heat dissipation unit covers the semiconductor sinks and the heat conduction unit; and the
(Continued)

semiconductor sinks are configured to absorb heat from the heat conduction unit and dissipate the heat through the heat dissipation unit, in response to a direct-current voltage applied to the semiconductor sinks.

20 Claims, 5 Drawing Sheets

(51) Int. Cl.
*H01L 51/52* (2006.01)
*H01L 51/56* (2006.01)

(56) References Cited

U.S. PATENT DOCUMENTS

| | | | |
|---|---|---|---|
| 7,926,979 | B2 | 4/2011 | Lai |
| 7,972,877 | B2 * | 7/2011 | Dai ............... H01L 33/645 438/22 |
| 2007/0188082 | A1 * | 8/2007 | Kato ............... H01L 51/529 313/504 |
| 2009/0231851 | A1 | 9/2009 | Lai |
| 2019/0280245 | A1 | 9/2019 | Kwon et al. |

FOREIGN PATENT DOCUMENTS

| | | | |
|---|---|---|---|
| CN | 104154508 | A | 11/2014 |
| CN | 107507518 | A | 12/2017 |
| CN | 109545950 | A | 3/2019 |
| CN | 208721955 | U | 4/2019 |
| CN | 110544431 | A | 12/2019 |
| JP | 2009193801 | A * | 8/2009 |

OTHER PUBLICATIONS

Zhao, Dongliang, and Gang Tan. "A Review of Thermoelectric Cooling: Materials, Modeling and Applications." Applied Thermal Engineering, vol. 66, No. 1-2, 2014, pp. 15-24., https://doi.org/10.1016/j.applthermaleng.2014.01.074. (Year: 2014).*

Y. Lee, E. Kim and K. G. Shin, "Efficient thermoelectric cooling for mobile devices," 2017 IEEE/ACM International Symposium on Low Power Electronics and Design (ISLPED), 2017, pp. 1-6, doi: 10.1109/ISLPED.2017.8009199. (Year: 2017).*

Kishore, R.A., Nozariasbmarz, A., Poudel, B. et al. Ultra-high performance wearable thermoelectric coolers with less materials. Nat Commun 10, 1765 (2019). https://doi.org/10.1038/s41467-019-09707-8. (Year: 2019).*

Office Action dated May 8, 2021, issued in counterpart CN Application No. 201911323458.X, with English Translation. (13 pages).

* cited by examiner

FOLDABLE DISPLAY MODULE, METHOD OF MANUFACTURING FOLDABLE DISPLAY MODULE, DISPLAY APPARATUS AND HEAT DISSIPATION METHOD

CROSS-REFERENCE TO RELATED APPLICATION

This application claims priority to Chinese Patent Application No. 201911323458.X, filed on Dec. 20, 2019 in China National Intellectual Property Administration, which is incorporated herein by reference in its entirety.

TECHNICAL FIELD

The present disclosure relates to the field of display technology, and particularly to a foldable display module, a method of manufacturing a foldable display module, a display apparatus and a heat dissipation method.

BACKGROUND

Organic light-emitting diode (OLED) flexible display devices have been sought after by the market in recent years because of their advantages such as self-luminousness, flexibility, and high contrast.

The display of large-sized and medium-sized OLED screens can bring stronger visual impact and viewing experience. However, they are inconvenient to carry due to their larger size, so that they can be applied to only particular circumstances. In order to solve the problem of their inconvenience in carrying, research and development personnel have proposed a foldable display module to provide portability. However, in practical applications, the heat dissipation structure of the existing foldable display module has certain limitations, reducing the service life of the OLED screens and affecting their display effect due to their poor heat dissipation property.

SUMMARY

In accordance with a first aspect of the present disclosure, there is provided a foldable display module comprising: a foldable OLED display panel; a heat conduction unit and a heat dissipation unit sequentially disposed on the OLED display panel in a direction away from a light exit side of the OLED display panel; and a plurality of semiconductor sinks located between the heat conduction unit and the heat dissipation unit, wherein:

the heat conduction unit is adhered to a side of the OLED display panel away from the light exit side and is configured to conduct heat from the OLED display panel;

the plurality of semiconductor sinks are disposed on the heat conduction unit;

the heat dissipation unit covers the plurality of semiconductor sinks and the heat conduction unit; and the plurality of semiconductor sinks are configured to absorb heat from the heat conduction unit and dissipate the heat through the heat dissipation unit, in response to a direct-current voltage applied to the plurality of semiconductor sinks.

In some embodiments, the foldable display module further comprises: a sensing unit configured to sense whether or not the OLED display panel is in an unfolded state, wherein the direct-current voltage is applied to the plurality of semiconductor sinks in response to the OLED display panel being in the unfolded state.

In some embodiments, the OLED display panel comprises a display area and a peripheral area around the display area, and the sensing unit comprises a light transmitter and a light receiver which are disposed in the peripheral area, wherein: the light transmitter is configured to transmit a light signal, and the light receiver is configured to receive the light signal and output an electrical signal in response to the OLED display panel being in the folded state.

In some embodiments, the light transmitter comprises an infrared transmitter configured to transmit infrared light, and the light receiver comprises an infrared receiver configured to receive the infrared light and output an electrical signal.

In some embodiments, the sensing unit comprises a photoelectric sensor configured to sense ambient light and output an electrical signal in response to the OLED display panel being in the unfolded state.

In some embodiments, the sensing unit comprises a piezoelectric sensor configured to sense a pressure and output an electrical signal in response to the OLED display panel being in the folded state.

In some embodiments, the sensing unit comprises a thermoelectric sensor configured to sense heat dissipated from the OLED display panel and output an electrical signal in response to the OLED display panel being in the unfolded state.

In some embodiments, the OLED display panel comprises a display area and a peripheral area around the display area, and the display area comprises a first flat part and a second flat part, and a bendable part connecting the first flat part and the second flat part; the heat conduction unit is adhered to the first flat part and the second flat part; and the plurality of semiconductor sinks are disposed on the heat conduction unit, and the heat dissipation unit covers the plurality of semiconductor sinks and the heat conduction unit.

In some embodiments, the plurality of semiconductor sinks are uniformly disposed on the heat conduction unit. In some other embodiments, the plurality of semiconductor sinks are disposed on the heat conduction unit in a position corresponding to a heat generating position of the OLED display panel.

In some embodiments, a portion of the heat dissipation unit on the first flat part has a surface facing away from the first flat part and having a first wavy structure, and ones of the plurality of semiconductor sinks on the first flat part are located at wave crests of the first wavy structure away from the first flat part, respectively; and a portion of the heat dissipation unit on the second flat part has a surface facing away from the second flat part and having a second wavy structure, and ones of the plurality of semiconductor sinks on the second flat part are located at wave crests of the second wavy structure away from the second flat part, respectively.

In some embodiments, a portion of the heat dissipation unit on the first flat part has a surface facing away from the first flat part and having a recess-protrusion structure, and ones of the plurality of semiconductor sinks on the first flat part are located at protrusions of the recess-protrusion structure away from the first flat part, respectively; and a portion of the heat dissipation unit on the second flat part has a surface facing away from the second flat part, and having a protrusion-recess structure matching the recess-protrusion structure, and ones of the plurality of semiconductor sinks on the second flat part are located at protrusions of the protrusion-recess structure away from the second flat part, respectively.

In some embodiments, a surface of the heat dissipation unit facing away from the heat conduction unit is a flat surface, and a surface of the heat dissipation unit facing towards the heat conduction unit has a recess-protrusion structure, and the plurality of semiconductor sinks are located at recesses of the recess-protrusion structure facing towards the heat conduction unit, respectively.

In some embodiments, the OLED display panel comprises: a flexible substrate; and a drive circuit layer, an OLED device layer and an encapsulation layer, sequentially disposed in a direction away from the flexible substrate.

In accordance with a second aspect of the present disclosure, there is provided a display apparatus comprising the foldable display module according to any one of the embodiments in the abovementioned aspect.

In accordance with a third aspect of the present disclosure, there is provided a heat dissipation method of the foldable display module according to any one of the embodiments in the first aspect, and the method comprises:

conducting heat from the OLED display panel by the heat conduction unit adhered to the side of the OLED display panel away from the light exit side;

absorbing the heat from the heat conduction unit and transferring the heat to the heat dissipation unit covering the plurality of semiconductor sinks, in response to the direct-current voltage applied to the plurality of semiconductor sinks, by the plurality of semiconductor sinks disposed on the heat conduction unit; and dissipating the heat by the heat dissipation unit.

In some embodiments, the foldable display module further comprises a sensing unit; the heat dissipation method further comprises: prior to conducting the heat from the OLED display panel by the heat conduction unit adhered to the side of the OLED display panel away from the light exit side, sensing whether or not the OLED display panel is in an unfolded state by the sensing unit, and applying a direct-current voltage to the plurality of semiconductor sinks in response to the OLED display panel being in the unfolded state.

In accordance with a fourth aspect of the present disclosure, there is provided a method of manufacturing the foldable display module according to any one of the embodiments in the first aspect, and the method comprises:

forming the foldable OLED display panel;

adhering the heat conduction unit to the side of the OLED display panel away from the light exit side;

forming the plurality of semiconductor sinks on the heat conduction unit; and forming the heat dissipation unit covering the plurality of semiconductor sinks and the heat conduction unit.

In some embodiments, the OLED display panel comprises a display area and a peripheral area around the display area, the method further comprises: forming, in the peripheral area of the OLED display panel, a sensing unit configured to sense whether the foldable display module is in a folded state or in an unfolded state.

In some embodiments, the display area comprises a first flat part and a second flat part, and a bendable part connecting the first flat part and the second flat part; and adhering the heat conduction unit to the side of the OLED display panel away from the light exit side comprises: adhering the heat conduction unit to the first flat part and the second flat part, respectively.

BRIEF DESCRIPTION OF THE DRAWINGS

In order to describe technical solutions in embodiments of the present disclosure more clearly, accompanying drawings required for describing the embodiments will be simply explained as below. Apparently, the accompanying drawings for the following description are only some embodiments of the present disclosure. Those skilled in the art also could derive other accompanying drawings from these accompanying drawings without making a creative work.

DETAILED DESCRIPTION

In order to describe the present disclosure more clearly, a further description of the present disclosure will be made as below with reference to embodiments taken in conjunction with the accompanying drawings. Similar elements are indicated by the same reference signs in the accompanying drawings. It would be appreciated by those skilled in the art that the contents specifically described below are illustrative rather than restrictive, and should not be used to limit the protection scope of the present disclosure.

It should be noted that the terms "on", "formed on" and "disposed on" described herein may mean that a layer is formed or disposed directly on another layer, or that a layer is formed or disposed indirectly on another layer, that is, between the two layers, there is a further layer. Herein, unless otherwise stated, the term "located in the same layer" used means that two layers, components, members, elements or parts can be formed by the same patterning process, and the two layers, components, members, elements or parts are generally formed of the same material. Herein, unless otherwise stated, the expression "patterning process" generally includes steps such as coating, exposing, and developing a photoresist, etching, and stripping the photoresist. The expression "single patterning process" means a process of forming a patterned layer, component, member, etc. with a single mask.

Figure 1:
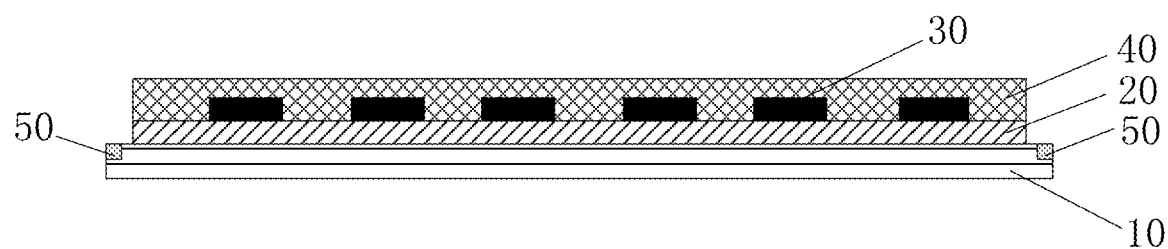
FIG. 1 is a schematic view showing a structure of a foldable display module according to an embodiment of the present disclosure.

As shown in FIG. 1, an embodiment of the present disclosure provides a foldable display module. The foldable display module includes: a foldable OLED display panel 10;

a heat conduction unit 20 and a heat dissipation unit 40 sequentially disposed on the OLED display panel 10 in a direction away from a light exit side of the OLED display panel 10; and a plurality of semiconductor sinks 30 located between the heat conduction unit 20 and the heat dissipation unit 40.

The heat conduction unit 20 is adhered to a side of the OLED display panel 10 away from the light exit side and is configured to conduct heat from the OLED display panel 10. The plurality of semiconductor sinks 30 are disposed on the heat conduction unit 20. The heat dissipation unit 40 covers the plurality of semiconductor sinks 30 and the heat conduction unit 20. The plurality of semiconductor sinks 30 are configured to absorb heat from the heat conduction unit 20 and dissipate the heat through the heat dissipation unit 40, in response to a direct-current voltage applied to the plurality of semiconductor sinks.

Figures 2A, 2B:
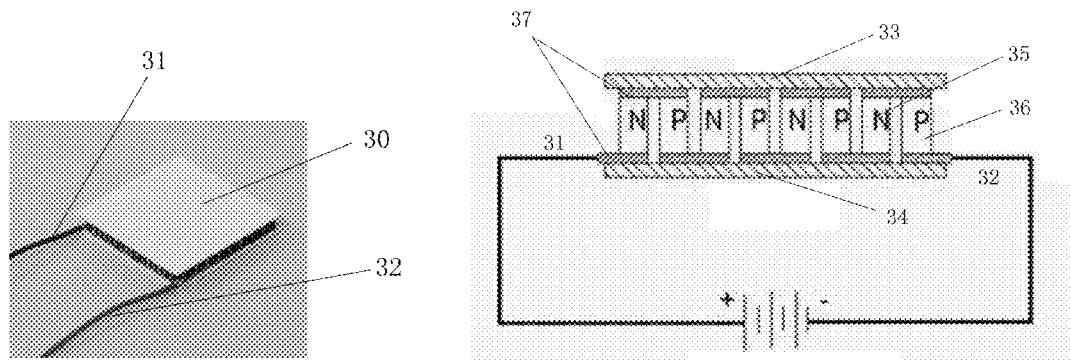
FIG. 2a is a photo of a semiconductor sink according to an embodiment of the present disclosure.
FIG. 2b is a schematic diagram showing a structure of a semiconductor sink according to an embodiment of the present disclosure.

In the present embodiment, the heat conduction unit is formed of a material having a high thermal conductivity, such as rolled copper foil, graphene, or the like, which can conduct heat generated by the OLED display panel. The semiconductor sink is semiconductor cooler with active heat dissipation performance, and the plurality of semiconductor sinks are closely adhered to the heat conduction unit. As shown in FIGS. 2a and 2b, the semiconductor sink 30 is a galvanic couple of two different semiconductor materials connected in series. The semiconductor sink 30 includes a first insulating ceramic plate 33, a second insulating ceramic plate 34, an N-type semiconductor 35, a P-type semiconductor 36, a metal conductor 37, and a cold end 31 and a hot end 32 for coupling of the semiconductor heat sink 30. The Peltier effect of semiconductor materials is used in the semiconductor sink. When a direct-current voltage is applied to the semiconductor sink, a generated direct current passes through the galvanic couple of the two different semiconductor materials connected in series. The two ends of the galvanic couple absorb heat and release heat, respectively, achieving the purpose of cooling. The heat dissipation unit is formed of a material having a high heat dissipation performance, such as copper foil, graphene, or the like. The heat dissipation unit covers the plurality of semiconductor sinks and exposed portions of the heat conduction unit to dissipate heat transferred by the plurality of semiconductor sinks and the heat conduction unit.

In the present embodiment, the semiconductor sink is equivalent to a heat pump. The heat conduction unit is coupled to the cold end of the semiconductor sink, and the heat dissipation unit is coupled to the hot end of the semiconductor sink. The semiconductor sink absorbs the heat of the OLED display panel from the heat conduction unit, and transfers the heat to the heat dissipation unit to dissipate the heat, in response to the direct-current voltage applied to the semiconductor sink. Therefore, in the present embodiment, heat can be actively dissipated from the OLED display panel through the heat conduction unit, the heat dissipation unit, and the plurality of semiconductor sinks, so that the heat of the foldable display module is effectively reduced, thereby alleviating problems existing in the related art, effectively improving the display effect of the foldable display module and prolonging the service life of the OLED display panel.

Figure 3A:
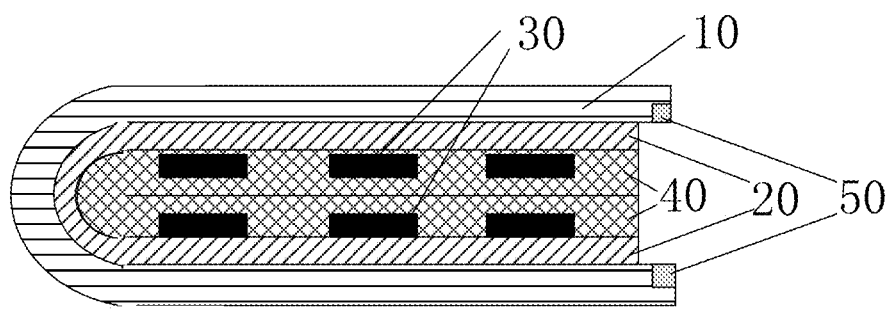
FIGS. 3a and 3b are schematic views showing a structure of a foldable display module in a folded state according to an embodiment of the present disclosure.
Figure 3B:
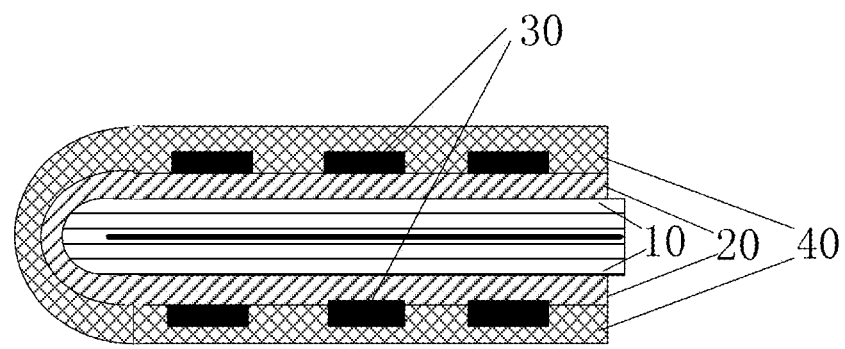

It should be noted that there is no particular limitation on a folded manner of the foldable display module in the present disclosure. The foldable display module as shown in FIG. 3a is configured to be foldable outwards such that the OLED display panel of the foldable display module faces outwards in the folded state, and the foldable display module as shown in FIG. 3b is configured to be foldable inwards such that the OLED display panel of the foldable display module faces inwards in the folded state. Whether the foldable display module is configured to be foldable outwards or inwards, the heat conduction unit, the heat dissipation unit, and the plurality of semiconductor sinks are disposed on the surface of the OLED display panel away from the light exit side, and dissipate heat generated by the OLED display panel in response to the direct-current voltage applied to the plurality of semiconductor sinks, thereby preventing the heat generated by the OLED display panel due to displaying from affecting the service life and performance of the devices.

In consideration of power consumption of the semiconductor sinks, in an optional embodiment, as shown in FIGS. 1 and 3a, the foldable display module further includes a sensing unit 50. The sensing unit 50 is configured to sense whether or not the OLED display panel is in an unfolded state. The direct-current voltage is applied to the plurality of semiconductor sinks 30 in response to the OLED display panel being in the unfolded state.

In the present embodiment, in consideration of characteristics that the foldable display module has a smaller display area and generates less heat in the outwardly folded state, does not display and generates no heat in the inwardly folded state, and has a larger display area and generates more heat in the unfolded state, in order to reduce the power consumption of the semiconductor sinks in operation, and prolong the endurance of the portable foldable display module, the foldable display module is provided with a sensing unit 50 configured to sense the state of the OLED display panel, such that the semiconductor sinks are not turned on when the OLED display panel is in the folded state, and are turned on to dissipate heat from the OLED display panel when the OLED display panel is in the unfolded state. In other words, by sensing the state of the OLED display panel, the sensing unit outputs an electrical signal which serves as a switching signal to apply the direct-current voltage to the semiconductor sinks. When the electrical signal indicates that the OLED display panel is in the unfolded state, the semiconductor sinks are turned on to dissipate the heat from the OLED display panel.

In an optional embodiment, the sensing unit includes a piezoelectric sensor configured to sense a pressure and output an electrical signal in response to the OLED display panel being in the folded state.

In the present embodiment, the piezoelectric sensor is located at a folded surface of the foldable display module. When the foldable display module is in the folded state, the piezoelectric sensor senses a pressure received by the folded surface, and outputs an electrical signal. Specifically, the piezoelectric sensor is disposed at a surface of the heat dissipation unit away from the OLED display panel when the foldable display module is configured to be foldable outwards. The piezoelectric sensor senses a pressure received by the heat dissipation unit and outputs an effective electrical signal when the foldable display module is in the folded state. No pressure is received by the heat dissipation unit and the piezoelectric sensor outputs no electrical signal or an ineffective electrical signal when the foldable display module is in the unfolded state. The piezoelectric sensor is disposed at a surface of the OLED display panel on the light exit side when the foldable display module is configured to be foldable inwards. The piezoelectric sensor senses a pressure received by the OLED display panel and outputs an effective electrical signal when the foldable display module is in the folded state. No pressure is received by the OLED display panel and the piezoelectric sensor outputs no electrical signal or an ineffective electrical signal when the foldable display module is in the unfolded state. Thereby, the semiconductor sinks dissipate heat from the OLED display panel in response to an application of the direct-current voltage to the semiconductor sinks by the electrical signal.

It should be noted that the piezoelectric sensor outputs an effective electrical signal when the foldable display module is in the folded state, and the direct-current voltage is applied to the semiconductor sinks when the foldable display module is in the unfolded state. Therefore, those skilled in the art should implement a reverse processing on the electrical signal output by the piezoelectric sensor in the circuit design, and use the reverse signal of the electrical signal as a switching signal to apply the direct-current voltage to the semiconductor sinks. Thereby, the semiconductor sinks are turned on to dissipate heat in response to the OLED display panel being in the unfolded state. In addition, when the piezoelectric sensor is disposed on the heat dissipation unit or the OLED display panel, the piezoelectric sensor may output the electrical signal through wired or wireless communication. Those skilled in the art should design an appropriate circuit according to actual application requirements, which will not be described herein for the sake of brevity.

In an optional embodiment, the sensing unit includes a photoelectric sensor configured to sense ambient light and output an electrical signal in response to the OLED display panel being in the unfolded state.

In the present embodiment, the photoelectric sensor is located at the folded surface of the foldable display module. When the foldable display module is in the folded state, the photoelectric sensor cannot sense the ambient light since the ambient light is shielded by the folded display module, and thus the photoelectric sensor outputs no electrical signal or an ineffective electrical signal. When the foldable display module is in the unfolded state, the photoelectric sensor can sense the ambient light, and outputs an effective electrical signal.

Like the previous embodiments, the photoelectric sensor is disposed at a surface of the heat dissipation unit away from the OLED display panel when the foldable display module is configured to be foldable outwards. The photoelectric sensor is disposed at a surface of the OLED display panel on the light exit side when the foldable display module is configured to be foldable inwards. When the foldable display module is in the folded state, the photoelectric sensor cannot sense the ambient light, and thus outputs no electrical signal or an ineffective electrical signal. When the foldable display module is in the unfolded state, the photoelectric sensor can sense the ambient light, and outputs an effective electrical signal. Thereby, the semiconductor sinks dissipate heat from the OLED display panel in response to an application of the direct-current voltage to the semiconductor sinks by the electrical signal.

It should be noted that those skilled in the art should set a light intensity threshold according to the electrical signals output by the photoelectric sensor when the foldable display module is in the folded state and the unfolded state. When the electrical signal output by the photoelectric sensor is greater than the light intensity threshold, it is judged that the OLED display panel is in the unfolded state. Otherwise, it is judged that the OLED display panel is in the folded state.

In order to improve the accuracy of sensing of the sensing unit, in an optional embodiment, the OLED display panel includes a display area and a peripheral area around the display area, and the sensing unit includes a light transmitter and a light receiver which are disposed in the peripheral area. The light transmitter is configured to transmit a light signal, and the light receiver is configured to receive the light signal and output an electrical signal in response to the OLED display panel being in the folded state.

In the present embodiment, as shown in FIGS. 1 and 3a, it is judged by the light transmitter and the light receiver disposed in pair whether or not the OLED display panel is in the folded state. The light transmitter and the light receiver are disposed in the peripheral area of the OLED display panel and correspond in position to each other. Whether the foldable display module is configured to be foldable outwards or inwards, light transmitted by the light transmitter covers a sensing range of the light receiver when the foldable display module is in the folded state as shown in FIG. 3a, whereas the light receiver cannot sense the light transmitted by the light transmitter when the foldable display module is in the unfolded state. In other words, when the OLED display panel is in the folded state, the light transmitter transmits light, and the light receiver corresponding in position to the light transmitter receive senses the light and outputs an effective electrical signal indicating that the OLED display panel is in the folded state. Otherwise, the photoelectric sensor outputs no electrical signal or an ineffective electrical signal. The sensing unit disposed in a pair of components according to the present embodiment can effectively improve the accuracy of sensing of the sensing unit, thereby further reducing the power consumption of the foldable display module.

In an optional embodiment, the light transmitter includes an infrared transmitter configured to transmit infrared light, and the light receiver includes an infrared receiver configured to receive the infrared light and output an electrical signal.

In consideration of the application circumstances of the foldable display module, in the present embodiment, with the infrared transmitter configured to transmit infrared light, and the infrared receiver configured to receive the infrared light, the folded state of the foldable display module can be sensed in a complex light environment.

Like the previous embodiments, the light transmitter and the light receiver according to the present embodiment are configured to sense the folded state of the foldable display module, rather than the unfolded state of the foldable display module, and thus those skilled in the art should design an appropriate circuit according to actual application requirements. The reverse signal of the electrical signal output by the light receiver is used as a switching signal to apply the direct-current voltage to the semiconductor sinks. Thereby, the semiconductor sinks are turned on to dissipate heat in response to the OLED display panel being in the unfolded state, which is no longer described herein for the sake of brevity.

In an optional embodiment, the sensing unit includes a thermoelectric sensor configured to sense heat dissipated from the OLED display panel and output an electrical signal in response to the OLED display panel being in the unfolded state.

In the present embodiment, the foldable display module is provided with thermoelectric sensor. In consideration of a difference between the heat generated by the OLED display panel in the folded state and the heat generated by the OLED display panel in the unfolded state, electrical signals output by the thermoelectric sensor when the OLED display panel is in the folded state and the unfolded state are measured, respectively, and a heat threshold of the thermoelectric sensor is set according to the measurement. When the electrical signal output by the thermoelectric sensor is greater than the heat threshold, it is judged that the OLED display panel is in the unfolded state. Thereby, the semiconductor sinks dissipate heat from the OLED display panel in response to an application of the direct-current voltage to the semiconductor sinks by the electrical signal.

It should be noted that there is no particular limitation on specific implementations of the sensing unit in the present disclosure, and all sensing units that are capable of judging whether the OLED display panel is in the folded state or in the unfolded state fall within the protection scope of the present disclosure. Those skilled in the art should select different sensing units according to actual application requirements, which will not be described herein for the sake of brevity.

Figure 4:
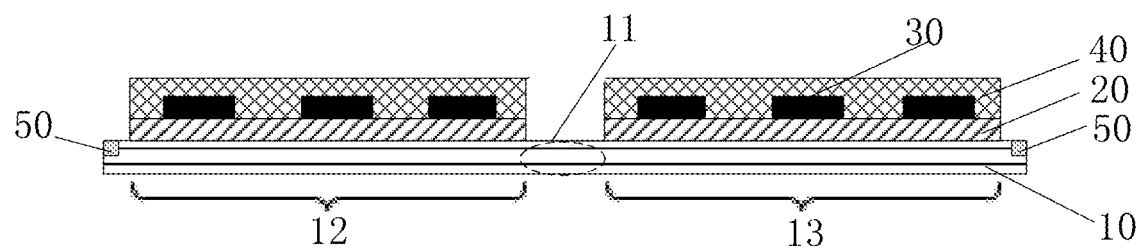
FIG. 4 is a schematic view showing a structure of a foldable display module according to another embodiment of the present disclosure.
Figure 5:
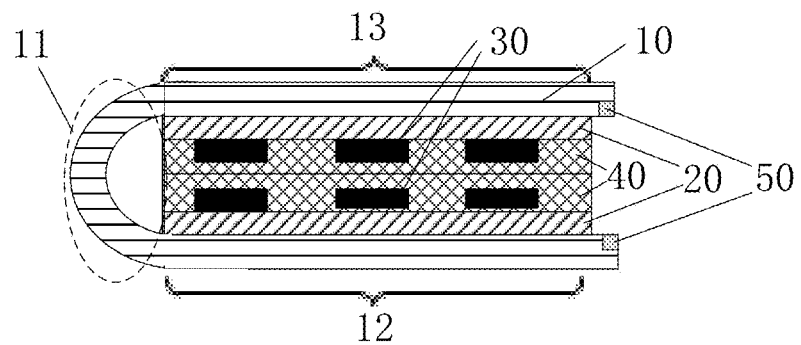
FIG. 5 is schematic view showing a structure of a foldable display module in a folded state according to another embodiment of the present disclosure.

In consideration of the problem of squeezing the heat conduction unit, the heat dissipation unit and the semiconductor sinks in the folded position when the OLED display panel is folded, in an optional embodiment, as shown in FIGS. 4 and 5, the OLED display panel includes a display area and a peripheral area around the display area, and the display area includes a first flat part 12 and a second flat part 13, and a bendable part 11 connecting the first flat part 12 and the second flat part 13. The heat conduction unit 20 is adhered to the first flat part 12 and the second flat part 13, and the plurality of semiconductor sinks 30 are disposed on the heat conduction unit 20, and the heat dissipation unit 40 covers the plurality of semiconductor sinks 30 and the heat conduction unit 20.

In the present embodiment, in order to ensure the stability of the foldable display module in the folded state, the OLED display panel includes the bendable part for folding, and the two flat parts separated by the bendable part, and the heat conduction unit, the semiconductor sinks, and the heat dissipation unit are disposed on only the flat parts, thereby, not only ensuring the effective heat dissipation, but also avoiding an influence of the heat conduction unit, the semiconductor sinks and the heat dissipation unit on the display performance of the foldable display module in the folded state due to extrusion at the bent position, and thus effectively improving the operational performance of the foldable display module. It should be noted that the first flat part and the second flat part may be arranged such that in the unfolded state, they are located on two symmetrical sides of the bendable part, respectively, while in the folded state, they are stacked.

In an optional embodiment, the plurality of semiconductor sinks 30 are uniformly disposed on the heat conduction unit 20, thereby uniformly dissipating heat from the OLED display panel.

In another optional embodiment, the plurality of semiconductor sinks 30 are disposed on the heat conduction unit in a position corresponding to a heat generating position of the OLED display panel.

In the present embodiment, considering that the heat generating position of the OLED display panel varies depending upon the arrangement of the circuit of the OLED display panel, the heat dissipation performance of the foldable display module can be improved by disposing the semiconductor sinks according to the heat generating position of the OLED display panel.

Figure 6:
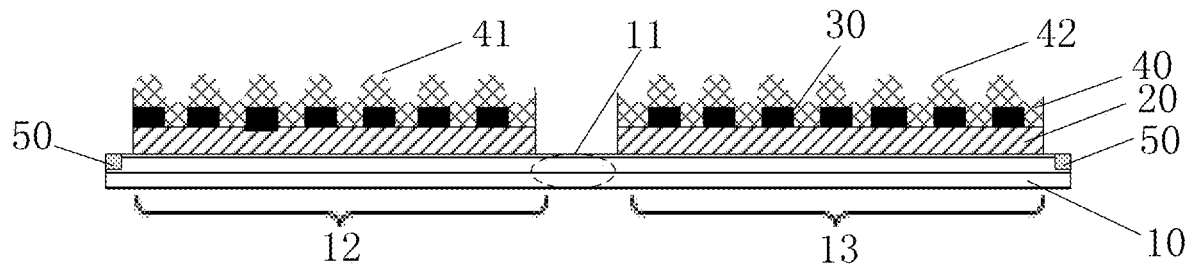
FIG. 6 is a schematic view showing a structure of a foldable display module according to still another embodiment of the present disclosure.

In order to further improve the heat dissipation performance of the foldable display module, in an optional embodiment, as shown in FIG. 6, a portion of the heat dissipation unit 40 on the first flat part 12 has a surface facing away from the first flat part 12 and having a first wavy structure 41, and ones of the plurality of semiconductor sinks 30 on the first flat part 12 are located at wave crests of the first wavy structure 41 away from the first flat part 12, respectively; and a portion of the heat dissipation unit 40 on the second flat part 13 has a surface facing away from the second flat part 13 and having a second wavy structure 42, and ones of the plurality of semiconductor sinks 30 on the second flat part 13 are located at wave crests of the second wavy structure 42 away from the second flat part 13, respectively.

In the present embodiment, the surface of the heat dissipation unit 40 away from the first flat part and the second flat part has the wavy structure which facilitates dissipating heat, thereby further increasing the heat dissipation area and enhancing the heat dissipation effect. In addition, in the present embodiment, the semiconductor sinks are disposed at the wave crests of the wavy structure of the heat dissipation unit relative to the first flat part and the second flat part. In other words, the semiconductor sinks are embedded in the heat dissipation unit to save the space.

Figure 7:
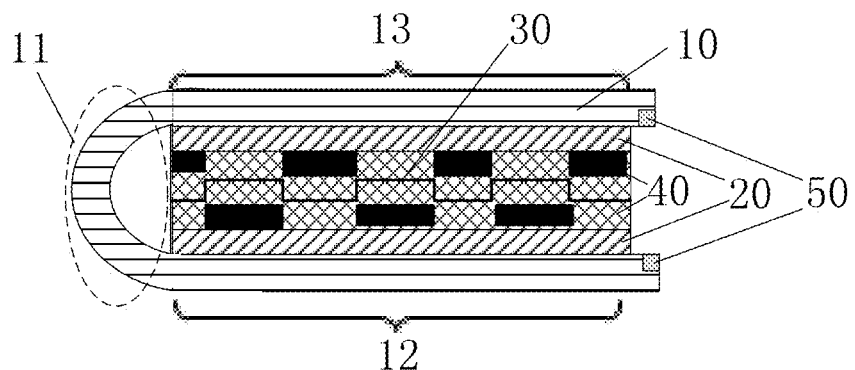
FIG. 7 is schematic view showing a structure of a foldable display module in a folded state according to yet another embodiment of the present disclosure.

In consideration of the foldable display module configured to be foldable outwards, in an optional embodiment, as shown in FIG. 7, a portion of the heat dissipation unit 40 on the first flat part 12 has a surface facing away from the first flat part 12 and having a recess-protrusion structure, and ones of the plurality of semiconductor sinks 30 on the first flat part 12 are located at protrusions of the recess-protrusion structure away from the first flat part 12, respectively; and a portion of the heat dissipation unit 40 on the second flat part 13 has a surface facing away from the second flat part 13, and having a protrusion-recess structure matching the recess-protrusion structure, and ones of the plurality of semiconductor sinks 30 on the second flat part 13 are located at protrusions of the protrusion-recess structure away from the second flat part 12, respectively.

In this embodiment, as shown in FIG. 7, in order to enhance the stability of the foldable display module, configured to be foldable outwards, in the folded state, the surface, facing away from the first flat part 12, of the portion of the heat dissipation unit 40 on the first flat part 12 has the recess-protrusion structure which can increase the heat dissipation area of the heat dissipation unit. Likewise, the surface, facing away from the second flat part 13, of the portion of the heat dissipation unit 40 on the second flat part 13 has the protrusion-recess structure corresponding to the recess-protrusion structure. On the one hand, the protrusion-recess structure can increase the heat dissipation area of the heat dissipation unit. On the other hand, when the foldable display module is folded, the recess-protrusion structure and the protrusion-recess structure are engaged with each other and match each other, thereby enhancing the stability of the foldable display module in the folded state, and also reducing a pressure applied to a folding hinge of the bendable part, and thus effectively improving the operational performance of the foldable display module. In addition, in the present embodiment, the semiconductor sinks are disposed at the protrusions of the recess-protrusion structure of the heat dissipation unit relative to the first flat part 12, and the protrusions of the protrusion-recess structure of the heat dissipation unit relative to the second flat part 13. In other words, the semiconductor sinks are embedded in the heat dissipation unit to save the space.

In consideration of the lightening and thinning performance of the foldable display module, in an optional embodiment, as shown in FIG. 4, a surface of the heat dissipation unit 40 facing away from the heat conduction unit 20 is a flat surface, and a surface of the heat dissipation unit 40 facing towards the heat conduction unit 20 has a recess-protrusion structure, and the plurality of semiconductor sinks 30 are located at recesses of the recess-protrusion structure facing towards the heat conduction unit 20, respectively.

In the present embodiment, the surface of the heat dissipation unit facing towards the semiconductor sinks has the recess-protrusion structure to save the space, and the other surface of the heat dissipation unit is the flat surface, so that the foldable display module is lightened and thinned while the heat dissipation requirement is meet, which can improve the portability of the foldable display module and has wide application prospects.

In an optional embodiment, the OLED display panel includes: a flexible substrate; and a drive circuit layer, an OLED device layer and an encapsulation layer, sequentially disposed in a direction away from the flexible substrate.

In the present embodiment, the OLED display panel has a conventional structure. The drive circuit layer includes: a buffer layer, an active layer, a gate insulating layer, a gate electrode, an interlayer insulating layer, a source-drain electrode layer, and a planarization layer. The OLED device layer includes: an OLED anode, an OLED light emitting layer, and an OLED cathode. It should be noted that the present embodiment is an exemplary implementation of the present disclosure, and is only used to explain the technical solution of the present disclosure. There are no particular limitations on specific structures of driving thin film transistors and OLED devices of the OLED display panel in the present disclosure. According to actual application requirements, those skilled in the art should select an appropriate OLED display panel with satisfying the heat dissipation performance of the foldable display module as a design criterion, which will not be described herein for the sake of brevity.

Corresponding to the foldable display module according to the above embodiments, an embodiment of the present disclosure further provides a heat dissipation method of the foldable display module according to the above embodiments. Since the heat dissipation method according to the embodiment of the present disclosure corresponds to the foldable display module according to the above embodiments, the above implementations are also applicable to the heat dissipation method according to the present embodiment, and are no longer described in detail in the present embodiment.

Figure 8:
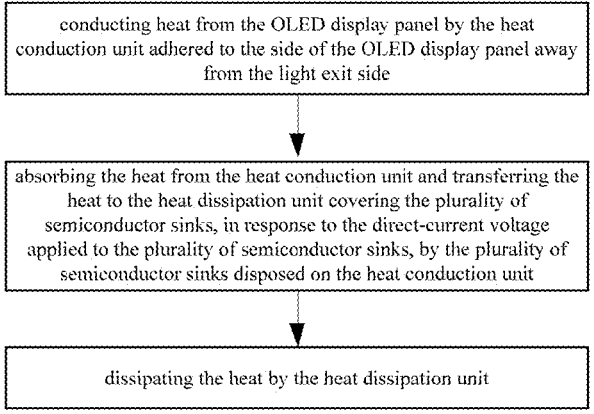
FIG. 8 is a flow diagram of a heat dissipation method according to an embodiment of the present disclosure.

As shown in FIG. 8, an embodiment of the present disclosure further provides a heat dissipation method of the above foldable display module. The heat dissipation method includes: conducting heat from the OLED display panel by the heat conduction unit adhered to the side of the OLED display panel away from the light exit side; absorbing the heat from the heat conduction unit and transferring the heat to the heat dissipation unit covering the plurality of semiconductor sinks, in response to the direct-current voltage applied to the plurality of semiconductor sinks, by the plurality of semiconductor sinks disposed on the heat conduction unit; and dissipating the heat by the heat dissipation unit.

In the present embodiment, firstly, the heat is conducted from the OLED display panel of the foldable display module by the heat conduction unit which is disposed on the side of the OLED display panel away from the light exit side and which is adhered directly to a side of the flexible substrate away from the OLED devices. Then, the heat conducted by the heat conduction unit is extracted to the heat dissipation unit, covering the semiconductor sinks and the heat conduction unit, through the semiconductor sinks to which the direct current voltage is applied. Therefore, the heat can be actively dissipated from the foldable display module, so that the heat generated by the foldable display module is effectively reduced, thereby improving the display effect of the foldable display module and prolonging the service life of the foldable display module.

In an optional embodiment, the foldable display module further includes a sensing unit; the heat dissipation method further includes: prior to conducting the heat from the OLED display panel by the heat conduction unit adhered to the side of the OLED display panel away from the light exit side, sensing whether or not the OLED display panel is in an unfolded state by the sensing unit, and applying a direct-current voltage to the plurality of semiconductor sinks in response to the OLED display panel being in the unfolded state.

In the present embodiment, in consideration of the power consumption of the semiconductor sinks and characteristics that the foldable display module has a smaller display area and generates less heat in the folded state, and has a larger display area and generates more heat in the unfolded state, the foldable display module is provided with the sensing unit configured to sense the state of the OLED display panel, such that when the OLED display panel is in the unfolded state, the direct current voltage is applied to the semiconductor sinks, i.e. the semiconductor sinks are turned on to dissipate heat from the OLED display panel, so that the power consumption of the foldable display module is reduced while the heat dissipation is ensured, and especially the endurance of the portable foldable display module can be prolonged, which has actual application prospects.

Figure 9:
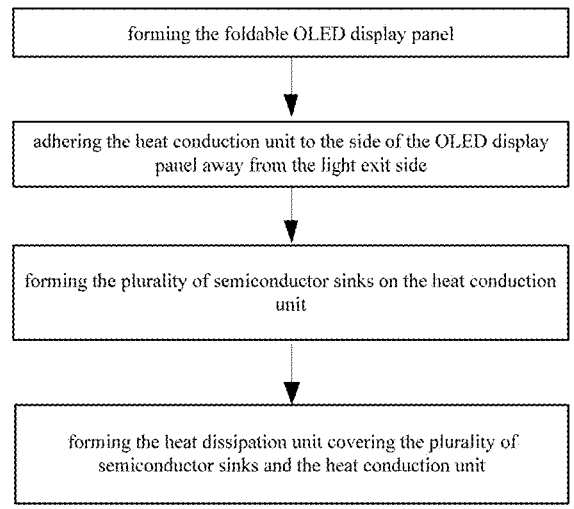
FIG. 9 is a flow diagram of a method of manufacturing a foldable display module according to an embodiment of the present disclosure.

Based on the above foldable display module, as shown in FIG. 9, an embodiment of the present disclosure further provides a method of manufacturing the above foldable display module. The method includes: forming the foldable OLED display panel; adhering the heat conduction unit to the side of the OLED display panel away from the light exit side; forming the plurality of semiconductor sinks on the heat conduction unit; and forming the heat dissipation unit covering the plurality of semiconductor sinks and the heat conduction unit.

In a specific embodiment, as shown in FIGS. 10*a*-10*e*, the specific steps of the method will be described as below.

Firstly, the foldable OLED display panel is formed.

Figure 10A:
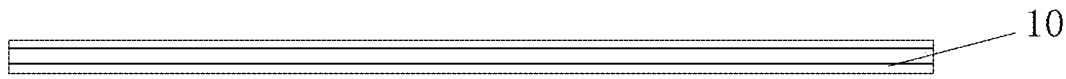
FIGS. 10a-10e are schematic views showing structures of a foldable display module in respective stages of its manufacturing process according to an embodiment of the present disclosure.

In the present embodiment, as shown in FIG. 10*a*, a foldable OLED display panel 10 is formed. The OLED display panel has a conventional structure and includes: a flexible substrate; and a buffer layer, an active layer, a gate insulating layer, a gate electrode, an interlayer insulating layer, a source-drain electrode layer, a planarization layer, a first electrode, an OLED light emitting layer, a second electrode, an encapsulation layer, and a cover plate, which are sequentially formed to be stacked in a direction away from the flexible substrate.

Considering that a great deal of electric energy will be consumed if the direct current voltage is always applied to the semiconductor sinks, in an optional embodiment, the method further includes:

forming a sensing unit on the OLED display panel.

Figure 10B:
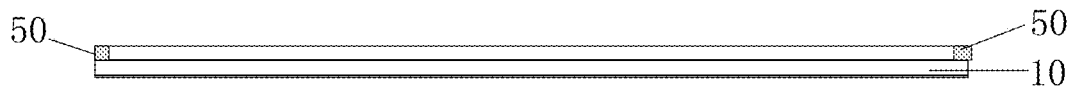

In the present embodiment, as shown in FIG. 10*b*, the OLED display panel includes a display area and a peripheral area around the display area, and the sensing unit 50 configured to sense whether the foldable display module is in a folded state or in an unfolded state is formed in the peripheral area of the OLED display panel 10. For example, the sensing unit is disposed in a pair of components, and the sensing unit has the same specific implementations as above. It should be noted that there is no particular limitation on specific devices used in the sensing unit in the present disclosure, for example, the sensing unit may be a sensor such as a photoelectric sensor, a piezoelectric sensor, and a thermoelectric sensor, and there is also no particular limitation on a position of the sensing unit in the present disclosure, with the capability of sensing the state of the foldable display module as a design criterion, which will no longer be described herein for the sake of brevity.

Next, the heat conduction unit is adhered to the side of the OLED display panel away from the light exit side.

Figure 10C:
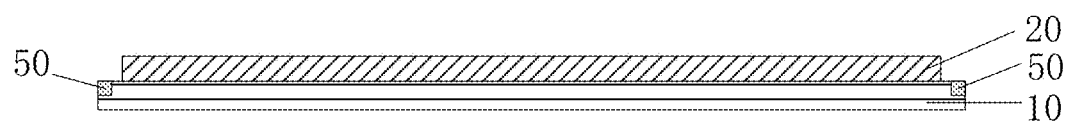

In the present embodiment, as shown in FIG. 10*c*, the heat conduction unit 20 is formed on a surface of the OLED display panel away from the light exit side.

In consideration of the stability of the foldable display module in the folded state, in an optional embodiment, the display area includes a first flat part and a second flat part, and a bendable part connecting the first flat part and the second flat part; and the heat conduction unit is adhered to the first flat part and the second flat part.

Next, the plurality of semiconductor sinks are formed on the heat conduction unit.

Figure 10D:
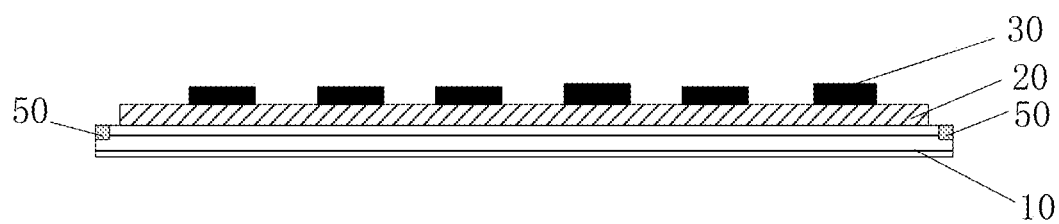

In the present embodiment, as shown in FIG. 10*d*, the plurality of semiconductor sinks 30 are formed on the heat conduction unit 20. The plurality of semiconductor sinks may be uniformly distributed on the heat conduction unit, thereby uniformly dissipating heat from the OLED display panel. The plurality of semiconductor sinks may also be disposed according to the heat generating position of the OLED display panel to improve the heat dissipation efficiency of the foldable display module.

Finally, the heat dissipation unit covering the plurality of semiconductor sinks and the heat conduction unit are formed.

Figure 10E:
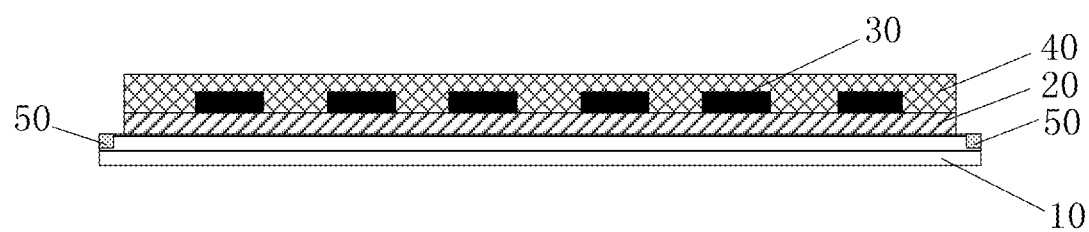

In the present embodiment, as shown in FIG. 10*e*, the heat dissipation unit 40 is formed. The heat dissipation unit 40 covers the plurality of semiconductor sinks 30 and the heat conduction unit 20. It should be noted that in order to improve the heat dissipation effect of the heat dissipation unit, the heat dissipation unit may have the recess-protrusion structure or the wavy structure on the side of the heat dissipation unit away from the OLED display panel to increase the heat dissipation area, and the semiconductor sinks are disposed at the protrusions of the recess-protrusion structure away from the OLED display panel, or the wave crests of the wavy structure away from the OLED display panel, respectively, to save the space. Those skilled in the art should use appropriate implementations according to actual application requirements, with dissipating heat from the OLED display panel as a design principle, which will not be described herein for the sake of brevity.

Based on the above foldable display module, an embodiment of the present disclosure further provides a display apparatus including the abovementioned foldable display module.

The display apparatus is a flexible OLED display apparatus. The display apparatus may include any products or parts having a displaying function, such as a mobile phone, a tablet computer, a TV, a display, a notebook computer, a digital frame, and a navigator.

In view of the problems existing in the related art, embodiments of the present disclosure provide a foldable display module, a method of manufacturing a foldable display module, a display apparatus and a heat dissipation method. In the foldable display module, heat is actively dissipated from the OLED display panel through the heat conduction unit, the heat dissipation unit, and the plurality of semiconductor sinks, so that the heat of the foldable display module can be reduced, thereby alleviating the problems existing in the related art, effectively improving the stability of the foldable display module and prolonging the service life of the devices. The foldable display module, the method of manufacturing the foldable display module, the display apparatus and the heat dissipation method have wide application prospects.

Apparently, the above-mentioned embodiments of the present disclosure are merely examples for clearly explaining the present disclosure, rather than limiting the embodiments of the present disclosure. Those of ordinary skill in the art could also make other different forms of changes or modifications on the basis of the above description, and it is not possible to exhaustively list all embodiments herein. All obvious changes or modifications derived from the technical solutions of the present disclosure are still within the protection scope of the present disclosure.

What is claimed is:

1. A foldable display module comprising: a foldable OLED display panel; a heat conduction unit and a heat dissipation unit sequentially disposed on the OLED display panel in a direction away from a light exit side of the OLED display panel; and a plurality of semiconductor sinks located between the heat conduction unit and the heat dissipation unit, wherein:

the heat conduction unit is adhered to a side of the OLED display panel away from the light exit side and is configured to conduct heat from the OLED display panel;

the plurality of semiconductor sinks are disposed on the heat conduction unit;

the heat dissipation unit covers the plurality of semiconductor sinks and the heat conduction unit; and the plurality of semiconductor sinks are configured to absorb heat from the heat conduction unit and dissipate the heat through the heat dissipation unit, in response to a direct-current voltage applied to the plurality of semiconductor sinks.

2. The foldable display module of claim 1, further comprising:

a sensing unit configured to sense whether or not the OLED display panel is in an unfolded state, wherein the direct-current voltage is applied to the plurality of semiconductor sinks in response to the OLED display panel being in the unfolded state.

3. The foldable display module of claim 2, wherein the OLED display panel comprises a display area and a peripheral area around the display area, and the sensing unit comprises a light transmitter and a light receiver which are disposed in the peripheral area, wherein:

the light transmitter is configured to transmit a light signal, and the light receiver is configured to receive the light signal and output an electrical signal in response to the OLED display panel being in the folded state.

4. The foldable display module of claim 3, wherein the light transmitter comprises an infrared transmitter configured to transmit infrared light, and the light receiver comprises an infrared receiver configured to receive the infrared light and output an electrical signal.

5. The foldable display module of claim 2, wherein the sensing unit comprises a photoelectric sensor configured to sense ambient light and output an electrical signal in response to the OLED display panel being in the unfolded state.

6. The foldable display module of claim 2, wherein the sensing unit comprises a piezoelectric sensor configured to sense a pressure and output an electrical signal in response to the OLED display panel being in the folded state.

7. The foldable display module of claim 2, wherein the sensing unit comprises a thermoelectric sensor configured to sense heat dissipated from the OLED display panel and output an electrical signal in response to the OLED display panel being in the unfolded state.

8. The foldable display module of claim 1, wherein the OLED display panel comprises a display area and a peripheral area around the display area, and the display area comprises a first flat part and a second flat part, and a bendable part connecting the first flat part and the second flat part;
the heat conduction unit is adhered to the first flat part and the second flat part; and
the plurality of semiconductor sinks are disposed on the heat conduction unit, and the heat dissipation unit covers the plurality of semiconductor sinks and the heat conduction unit.

9. The foldable display module of claim 8, wherein
the plurality of semiconductor sinks are uniformly disposed on the heat conduction unit.

10. The foldable display module of claim 8, wherein
the plurality of semiconductor sinks are disposed on the heat conduction unit in a position corresponding to a heat generating position of the OLED display panel.

11. The foldable display module of claim 8, wherein
a portion of the heat dissipation unit on the first flat part has a surface facing away from the first flat part and having a first wavy structure, and ones of the plurality of semiconductor sinks on the first flat part are located at wave crests of the first wavy structure away from the first flat part, respectively; and
a portion of the heat dissipation unit on the second flat part has a surface facing away from the second flat part and having a second wavy structure, and ones of the plurality of semiconductor sinks on the second flat part are located at wave crests of the second wavy structure away from the second flat part, respectively.

12. The foldable display module of claim 8, wherein
a portion of the heat dissipation unit on the first flat part has a surface facing away from the first flat part and having a recess-protrusion structure, and ones of the plurality of semiconductor sinks on the first flat part are located at protrusions of the recess-protrusion structure away from the first flat part, respectively; and
a portion of the heat dissipation unit on the second flat part has a surface facing away from the second flat part, and having a protrusion-recess structure matching the recess-protrusion structure, and ones of the plurality of semiconductor sinks on the second flat part are located at protrusions of the protrusion-recess structure away from the second flat part, respectively.

13. The foldable display module of claim 1, wherein a surface of the heat dissipation unit facing away from the heat conduction unit is a flat surface, and a surface of the heat dissipation unit facing towards the heat conduction unit has a recess-protrusion structure, and the plurality of semiconductor sinks are located at recesses of the recess-protrusion structure facing towards the heat conduction unit, respectively.

14. The foldable display module of claim 1, wherein the OLED display panel comprises: a flexible substrate; and a drive circuit layer, an OLED device layer and an encapsulation layer, sequentially disposed in a direction away from the flexible substrate.

15. A display apparatus comprising the foldable display module of claim 1.

16. A heat dissipation method of the foldable display module of claim 1, the method comprising:
conducting heat from the OLED display panel by the heat conduction unit adhered to the side of the OLED display panel away from the light exit side;
absorbing the heat from the heat conduction unit and transferring the heat to the heat dissipation unit covering the plurality of semiconductor sinks, in response to the direct-current voltage applied to the plurality of semiconductor sinks, by the plurality of semiconductor sinks disposed on the heat conduction unit; and
dissipating the heat by the heat dissipation unit.

17. The heat dissipation method of claim 14, wherein:
the foldable display module further comprises a sensing unit;
the heat dissipation method further comprises: prior to conducting the heat from the OLED display panel by the heat conduction unit adhered to the side of the OLED display panel away from the light exit side,
sensing whether or not the OLED display panel is in an unfolded state by the sensing unit, and applying a direct-current voltage to the plurality of semiconductor sinks in response to the OLED display panel being in the unfolded state.

18. A method of manufacturing the foldable display module of claim 1, the method comprising:
forming the foldable OLED display panel;
adhering the heat conduction unit to the side of the OLED display panel away from the light exit side;
forming the plurality of semiconductor sinks on the heat conduction unit; and
forming the heat dissipation unit covering the plurality of semiconductor sinks and the heat conduction unit.

19. The method of claim 18, wherein: the OLED display panel comprises a display area and a peripheral area around the display area,
the method further comprises: forming, in the peripheral area of the OLED display panel, a sensing unit configured to sense whether the foldable display module is in a folded state or in an unfolded state.

20. The method of claim 18, wherein: the display area comprises a first flat part and a second flat part, and a bendable part connecting the first flat part and the second flat part; and
adhering the heat conduction unit to the side of the OLED display panel away from the light exit side comprises: adhering the heat conduction unit to the first flat part and the second flat part, respectively.

* * * * *